(12) United States Patent
Kirloskar et al.

(10) Patent No.: US 6,933,176 B1
(45) Date of Patent: Aug. 23, 2005

(54) BALL GRID ARRAY PACKAGE AND PROCESS FOR MANUFACTURING SAME

(75) Inventors: Mohan Kirloskar, Cupertino, CA (US); Chun Ho Fan, Sham Tseng (HK); Neil McLellan, Danville, CA (US)

(73) Assignee: Asat Ltd., New Territories (HK)

( * ) Notice: Subject to any disclaimer, the term of this patent is extended or adjusted under 35 U.S.C. 154(b) by 0 days.

(21) Appl. No.: 10/647,696

(22) Filed: Aug. 25, 2003

Related U.S. Application Data

(63) Continuation-in-part of application No. 10/643,961, filed on Aug. 20, 2003, which is a continuation of application No. 10/323,657, filed on Dec. 20, 2002, which is a continuation-in-part of application No. 10/197,832, filed on Jul. 19, 2002, now Pat. No. 6,800,948.

(51) Int. Cl.$^7$ .......................... H01L 21/44; H01L 21/48; H01L 21/50; H01L 23/48; H01L 23/52
(52) U.S. Cl. ..................... 438/122; 438/108; 438/127; 257/778; 257/712; 264/272.17
(58) Field of Search ................................ 438/108, 122, 438/127; 257/778, 712; 264/272.17

(56) References Cited

U.S. PATENT DOCUMENTS

| | | | |
|---|---|---|---|
| 5,172,213 A | 12/1992 | Zimmerman | 257/798 |
| 5,311,060 A | 5/1994 | Rostoker et al. | 257/796 |
| 5,339,216 A | 8/1994 | Lin et al. | 361/707 |
| 5,444,025 A * | 8/1995 | Sono et al. | 29/827 |
| 5,493,153 A | 2/1996 | Arikawa et al. | 257/796 |
| 5,610,442 A | 3/1997 | Schneider et al. | 257/787 |
| 5,639,694 A | 6/1997 | Diffenderfer et al. | 437/209 |
| 5,650,663 A | 7/1997 | Parthasarathi | 257/706 |
| 5,679,978 A | 10/1997 | Kawahara et al. | 257/697 |
| 5,705,851 A | 1/1998 | Mostafazadeh et al. | 257/675 |
| 5,736,785 A | 4/1998 | Chiang et al. | |
| 5,773,362 A * | 6/1998 | Tonti et al. | 438/665 |
| 5,877,552 A | 3/1999 | Chiang | |
| 5,977,626 A | 11/1999 | Wang et al. | |
| 5,986,885 A | 11/1999 | Wyland | 361/704 |
| 6,037,658 A | 3/2000 | Brodsky et al. | |
| 6,236,568 B1 | 5/2001 | Lai et al. | 361/704 |
| 6,251,706 B1 | 6/2001 | Paniccia | 438/122 |
| 6,323,066 B2 | 11/2001 | Lai et al. | 438/122 |
| 6,414,385 B1 | 7/2002 | Huang et al. | 257/690 |

(Continued)

FOREIGN PATENT DOCUMENTS

DE 100 15 962 10/2001

OTHER PUBLICATIONS

U.S. Appl. No. 10/643,961, filed Aug. 20, 2003, Chun Ho Fan et al., "Improved Ball Grid Array Package and Process for Manufacturing Same".

U.S. Appl. No. 10/323,657, filed Dec. 20, 2002, Chun Ho Fan et al., "Process for Manufacturing Ball Grid Array Package".

(Continued)

*Primary Examiner*—Craig A. Thompson
*Assistant Examiner*—Nema Berezny
(74) *Attorney, Agent, or Firm*—Keating & Bennett, LLP

(57) ABSTRACT

A ball grid array integrated circuit package is manufactured by mounting a semiconductor die, to a surface of a substrate such that bumps on the semiconductor die are electrically connected to conductive traces of the substrate. At least one collapsible spacer is mounted to at least one of a heat spreader, the semiconductor die and the substrate. The heat spreader is fixed to the at least one of the first surface of the substrate and the semiconductor die such that he at least one collapsible spacer is disposed therebetween. A ball grid array is formed on a second surface of the substrate, bumps of the ball grid array being electrically connected to the conductive traces and the integrated circuit package is singulated.

23 Claims, 16 Drawing Sheets

U.S. PATENT DOCUMENTS

| | | |
|---|---|---|
| 6,462,405 B1 | 10/2002 | Lai et al. .................... 257/675 |
| 6,525,421 B1 | 2/2003 | Chia et al. .................. 257/730 |
| 6,631,078 B2 | 10/2003 | Alcoe et al. |
| 6,656,770 B2 * | 12/2003 | Atwood et al. ............. 438/118 |
| 2001/0015492 A1 | 8/2001 | Akram et al. ............... 257/706 |
| 2002/0005578 A1 | 1/2002 | Kodama et al. |
| 2002/0006718 A1 | 1/2002 | Distefano ................... 438/617 |
| 2002/0180035 A1 * | 12/2002 | Huang et al. ............... 257/706 |
| 2002/0185734 A1 | 12/2002 | Zhao et al. ................. 257/737 |
| 2003/0034569 A1 | 2/2003 | Caletka et al. .............. 257/796 |

OTHER PUBLICATIONS

U.S. Appl. No. 10/372,421, filed Feb. 24, 2003, Joseph Andrew Martin et al., "Improved Ball Grid Array Package".

U.S. Appl. No. 10/197,832, filed Jul. 19, 2002, Joseph Andrew Martin et al., "Improved Ball Grid Array Package".

* cited by examiner

BALL GRID ARRAY PACKAGE AND PROCESS FOR MANUFACTURING SAME

CROSS REFERENCE TO RELATED APPLICATION

This is a continuation-in-part of applicant's co-pending U.S. patent application Ser. No. 10/643,961 entitled, Improved Ball Grid Array Package and Process for Manufacturing Same, filed Aug. 20, 2003, which is a continuation of co-pending U.S. patent application Ser. No. 10/323,657 entitled, Process For Manufacturing Ball Grid Array Package, filed Dec. 20, 2002, which is a continuation-in-part of U.S. patent application Ser. No. 10/197,832 entitled Improved Ball Grid Array Package, filed Jul. 19, 2002, now U.S. Pat. No. 6,800,948. The contents of each of these applications is incorporated herein by reference.

FIELD OF THE INVENTION

The present invention relates in general to integrated circuit packaging, and in particular to an improved ball grid array package with enhanced thermal characteristics and a unique method of manufacturing the ball grid array package.

BACKGROUND OF THE INVENTION

High performance integrated circuit (IC) packages are well known in the art. Improvements in IC packages are driven by industry demands for increased thermal and electrical performance and decreased size and cost of manufacture.

In general, array packaging such as Plastic Ball Grid Array (PBGA) packages provide a high density of interconnects relative to the surface area of the package. However, typical PBGA packages include a convoluted signal path, giving rise to high impedance and an inefficient thermal path which results in low thermal dissipation performance. With increasing package density, the spreading of heat generated by the package is increasingly important.

Reference is made to FIG. 1, which shows an elevation view of a conventional PBGA package indicated generally by the numeral 20. The PBGA package 20 includes a substrate 22 and a semiconductor die 24 attached to the substrate 22 by a die adhesive. Gold wire bonds 26 electrically connect the die 24 to metal traces on the substrate 22. The wire bonds and die 24 are encapsulated in a molding compound 28. Solder balls 30 are disposed on the bottom surface of the substrate 22 for signal transfer. Because of the absence of a thermal path away from the semiconductor die 24, thermal dissipation in this package is poor.

Variations to conventional BGA packages have been proposed for the purpose of increasing thermal and electrical performance. One particular variation includes the addition of a metal heat spreader to the package, as shown in FIG. 2 which shows an elevation view of a PBGA package 20 of the prior art including the heat spreader, indicated by the numeral 32. In general, the metal heat spreader is fixed to the molded package. This package suffers disadvantages, however, as heat must be dissipated from the semiconductor die 24, through the molding compound 28 and then through the heat spreader 32.

It is therefore an object of an aspect of the present invention to provide a process for manufacturing a BGA package with a heat spreader that obviates or mitigates at least some of the disadvantages of the prior art.

SUMMARY OF THE INVENTION

In one aspect, a ball grid array integrated circuit package is manufactured by mounting a semiconductor die, to a first surface of a substrate such that bumps on the semiconductor die are electrically connected to conductive traces of the substrate. At least one collapsible spacer is mounted to at least one of a heat spreader, the semiconductor die and the substrate. The heat spreader is fixed to the at least one of the first surface of the substrate and the semiconductor die such that the at least one collapsible spacer is disposed therebetween. A ball grid array is formed on a second surface of the substrate, bumps of the ball grid array being electrically connected to the conductive traces and the integrated circuit package is singulated.

In another aspect, a ball grid array integrated circuit package is manufactured by mounting a semiconductor die, to a first surface of a substrate such that bumps on the semiconductor die are electrically connected to conductive traces of the substrate. At least one collapsible spacer is mounted to at least one of a heat spreader, the semiconductor die and the substrate. One of the heat spreader and the substrate is placed in a mold cavity and; the other of the heat spreader and the substrate is releasably clamped to a die of the mold cavity, such that the collapsible spacer is disposed between the heat spreader and the substrate. A molding compound is molded in the mold, thereby molding the semiconductor die, the substrate, the at least one collapsible spacer and the heat spreader into the molding compound to provide a molded package. A ball grid array is formed on a second surface of the substrate, bumps of the ball grid array being electrically connected to the conductive traces and the integrated circuit package is singulated.

In another aspect, there is provided a process for manufacturing a plurality of integrated circuit packages. The process includes mounting a plurality of semiconductor dice to a first surface of a substrate array such that bumps on the semiconductor dice are electrically connected to conductive traces of the substrate. A collapsible spacer array is mounted to one of a heat spreader array and the substrate array. One of the heat spreader array and the substrate array is placed in a mold cavity and the other of the heat spreader array and the substrate array is clamped to a first die of the mold such that the collapsible spacer array is disposed between the heat spreader array and the substrate array. A molding compound is molded In the mold, thereby molding the semiconductor dice, the substrate array, the collapsible spacer array and the heat spreader array into the molding compound to provide an array of molded packages. A plurality of ball grid arrays are formed on a second surface of the substrate array, bumps of the ball grid arrays being electrically connected to the conductive traces, and each integrated circuit package is singulated from the array of molded packages.

In yet another aspect, there is provided an integrated circuit package. The integrated circuit package includes a substrate having a plurality of conductive traces and a semiconductor die flip-chip mounted to a first surface of the substrate such that bumps of the semiconductor die are electrically connected to the ones of the plurality of conductive traces. A heat spreader is disposed proximal to and spaced from the semiconductor die by at least one collapsible spacer. A molding compound encapsulates the semiconductor die and the collapsible spacer between the substrate and the heat spreader. A ball grid array is disposed on a second surface of the substrate, bumps of the ball grid array being electrically connected to the conductive traces.

Advantageously, a heat spreader is incorporated into the BGA package during manufacture. The heat spreader is prepared and placed in the mold and is incorporated into the package by molding. An array of heat spreaders is placed in the mold and molded with a substrate array such that a plurality of packages including heat spreaders are manufactured in a single mold shot.

A thermal path is provided from the semiconductor die, through the collapsible spacer and to the heat spreader. Also, the heat spreader is effectively pressed against the lower mold die surface during molding, thereby inhibiting mold flash on the outer side of the heat spreader. The incorporation of a deformable material (collapsible spacer) that is stable at molding temperature, provides a compliant layer between the substrate and the heat spreader and the between the semiconductor die and the heat spreader. Thus, the heat spreader is pressed against the lower mold die, maintaining the heat spreader in contact with the lower mold die during molding and reducing mold flash.

In another aspect the semiconductor die is bonded to the semiconductor die is attached to the substrate such that pads of the semiconductor die are electrically connected to the conductive traces of the substrate. Thus, wire bonds between the semiconductor die and the substrate are not required in the present embodiment. Advantageously, this arrangement obviates problems associated with electrical impedence in wire bonds.

BRIEF DESCRIPTION OF THE DRAWINGS

The invention will be better understood with reference to the following description and to the drawings, in which:

FIGS. 7A to 7L show processing steps for manufacturing a ball grid array package, in accordance with another embodiment of the present invention.

DETAILED DESCRIPTION OF THE PREFERRED EMBODIMENTS

Figure 1:
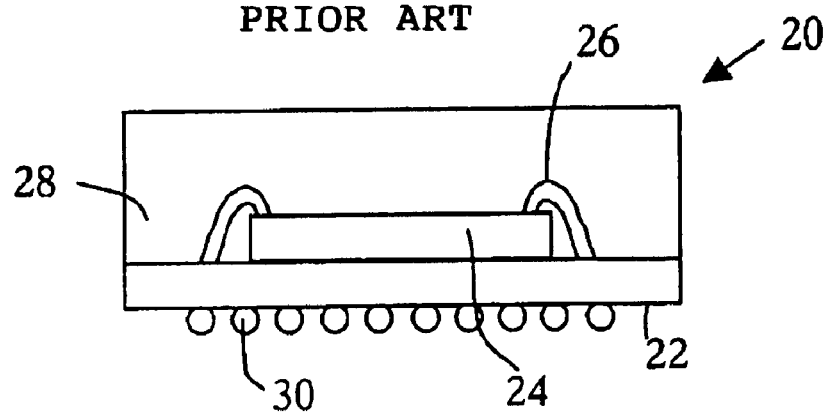
FIG. 1 shows an elevation view of a conventional plastic ball grid array package.
Figure 2:
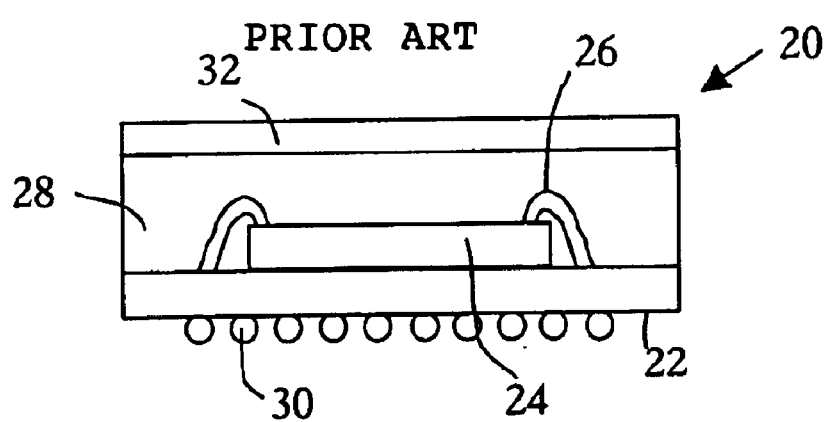
FIG. 2 shows an elevation view of a prior art plastic ball grid array package including a heat spreader.

Reference is now made to FIGS. 3A to 3J to describe a process for manufacturing a ball grid array integrated circuit package, referred to herein as a ball grid array package, according to an embodiment of the present invention. To simplify the description, the numerals used previously in describing FIG. 1 will be used again after raising the numerals by 100 where parts to be described correspond to parts already described.

Figure 3A:
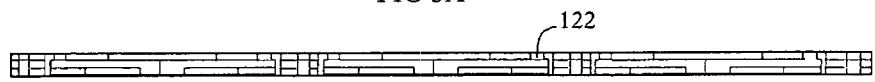
FIGS. 3A to 3J show processing steps for manufacturing a ball grid array package, in accordance with one embodiment of the present invention.
Figure 3B:
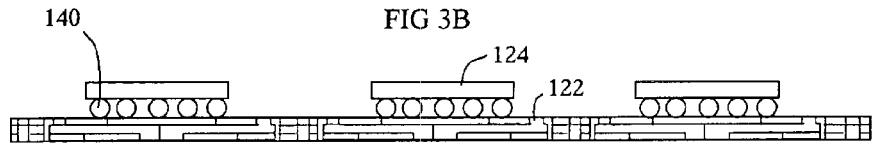
Figure 3C:
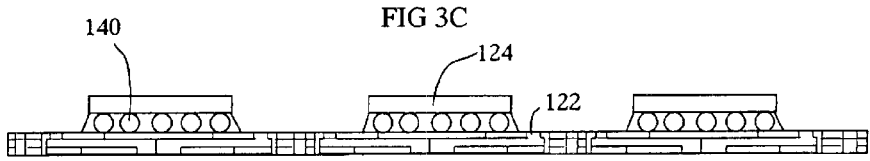
Figure 3D:
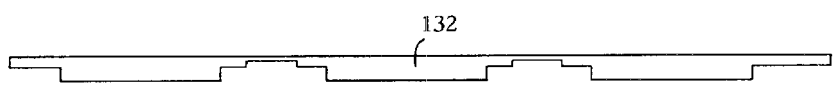
Figure 3E:
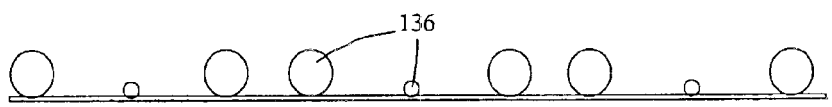
Figure 3F:
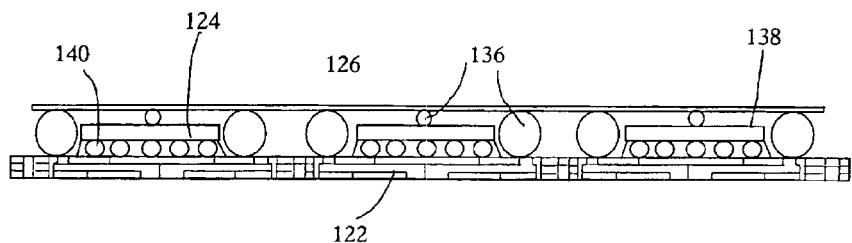
Figure 3G:
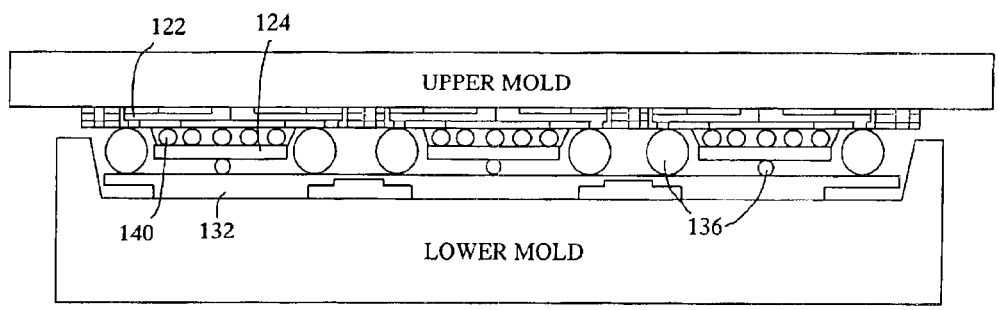
Figure 3H:
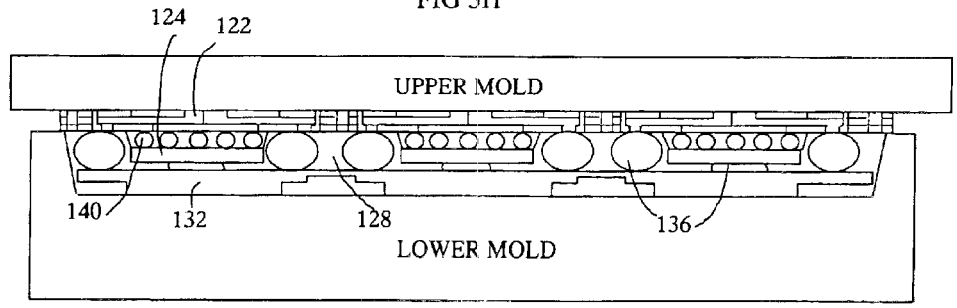
Figure 3I:
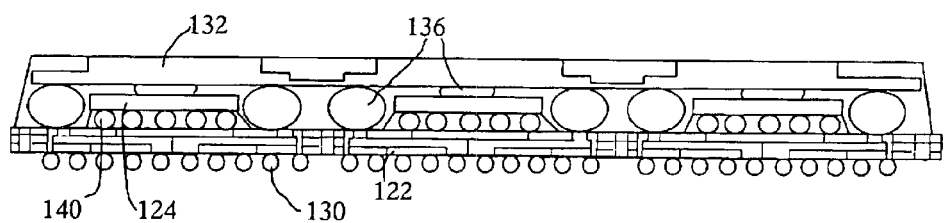
Figure 3J:
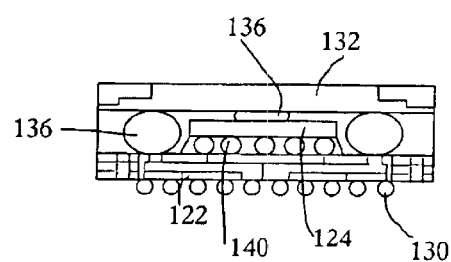

Referring to FIG. 3J, the ball grid array package is indicated generally by the numeral 120. The ball grid array package 120 includes a substrate 122 having a plurality of conductive traces and a semiconductor die 124 flip-chip mounted to a first surface of the substrate 122 such that bumps 140 of the semiconductor die 124 are electrically connected to the ones of the plurality of conductive traces. A heat spreader 132 is disposed proximal to and spaced from the semiconductor die 124 by at least one collapsible spacer 136. A ball grid array 130 is disposed on a second surface of the substrate 122, bumps of the ball grid array 130 being electrically connected to the conductive traces.

The process for manufacturing the ball grid array package 120, according to one embodiment of the present Invention, will now be described in more detail. Referring to FIG. 3A, the substrate 122 of a BT resin/glass epoxy printed circuit board with conductive traces for signal transfer is shown. A solder mask is disposed on the lower surface of the substrate, with portions of the conductive traces (interconnects) exposed. The substrate 122 is in the form of an array strip for producing a number of BGA units. Three such units are depicted in an array in FIG. 3A.

The singulated semiconductor die 124 including solder bumps 140 on conductive pads of the semiconductor die 124, is flip-chip mounted to an upper surface of the substrate 122 by solder reflow technique. (FIG. 3B). As will be appreciated, the semiconductor die 124 is flip-chip mounted such that the solder bumps 140 are mounted to ones of the conductive traces of the substrate 122, thereby electrically connecting the conductive pads of the semiconductor die 124 to the conductive traces of the substrate 122.

Next, the gap between the semiconductor die 124 and the top surface of the substrate 122 is underfilled with epoxy (FIG. 3C).

The heat spreader 132 is manufactured in the form of an array frame that is compatible with the substrate array 122 (FIG. 3D). In the present embodiment the heat spreader is a copper strip that is etched to form the array frame. The array frame includes a number of heat spreaders 132 joined together by partially-etched tie-bars. Three such heat spreaders are depicted in FIG. 3D.

A plurality of collapsible spacers 136 are manufactured in the form of an array that is compatible with the substrate array 122 and the heat spreader 132 (FIG. 3E). The collapsible spacers 136 are comprised of a solder preform of a plurality of substantially spherical balls connected together by tie bars. The collapsible spacers 136 are mounted to the substrate 122 using epoxy. It will be appreciated that some of the collapsible spacers 136 are mounted directly on the substrate 122 and other collapsible spacers 136 are mounted to corresponding semiconductor dice 124 (FIG. 3F).

Figure 4:
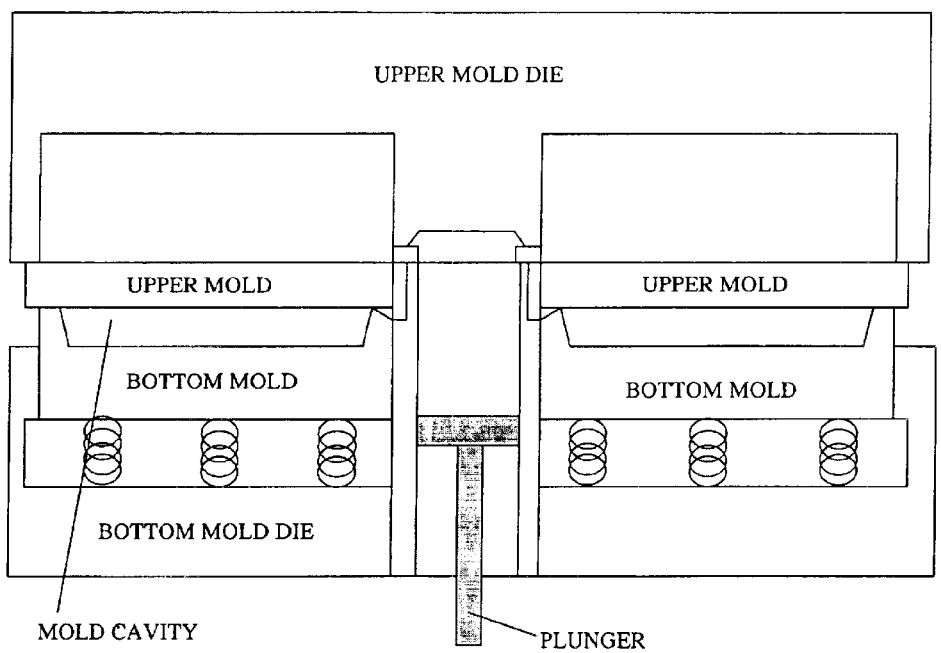
FIG. 4 shows a mold including molding dies and a mold cavity for molding the ball grid array package according to an embodiment of the present invention.

The heat spreader 132, in the array format, is placed in the bottom of a mold die cavity, on the lower surface of the mold. Features of the mold cavity and the frame are designed such that the heat spreader 132 aligns with the substrate 122 in the die cavity. The substrate array strip 122 is clamped to a surface of an upper mold die, in the mold cavity such that the semiconductor die 124 and the collapsible spacers 136 protrude from the substrate 22 into the mold cavity. The collapsible spacers 136, in the array format, are thus disposed between the heat spreader 132 and the substrate 122 (FIG. 3G). A suitable mold including the molding dies and mold cavity is shown in FIG. 4.

Molding using a molding compound 128 in the mold die cavity follows. During molding, the collapsible spacers 136 are compressed between the substrate 122 and the heat spreader 132 and between the semiconductor die 124 and the heat spreader 132, causing deformation of the collapsible spacers 136 (FIG. 3H). The heat spreader 132 is thereby pressed against the lower surface of the mold in the mold die cavity. The molding compound 128 encapsulates the semiconductor die 124, and the collapsible spacers 136 between the heat spreader 132 and the substrate 122, and joins the heat spreader 132 to the remainder of the package 120.

After removing the package 120 from the mold, the solder balls 130, also referred to as solder bumps, in the form of a ball grid array, are formed on the lower surface of the substrate 122 by conventional positioning (FIG. 3I). To attach the solder balls 130, a flux is added to the balls prior to placement and, after placement the solder balls 130 are reflowed using known reflow techniques. The solder balls 130 are thereby connected to the conductive traces of the substrate 122 and through the solder bumps 140 of the semiconductor die 124 to the semiconductor die 124. The solder balls 130 provide signal and power connections as well as ground connections for the semiconductor die 124.

Singulation of the individual BGA unit from the array strip is then performed either by saw singulation or die punching, resulting in the configuration shown in FIG. 3J. Thus, the individual BGA package is isolated from the strip.

Figure 5A:
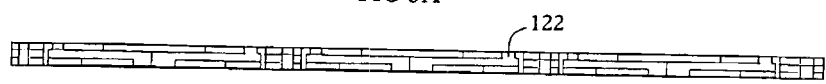
FIGS. 5A to 5J show processing steps for manufacturing a ball grid array package, in accordance with another embodiment of the present invention.
Figure 5B:
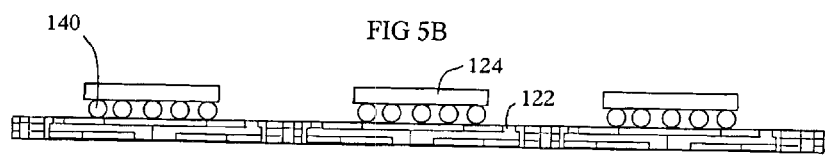
Figure 5C:
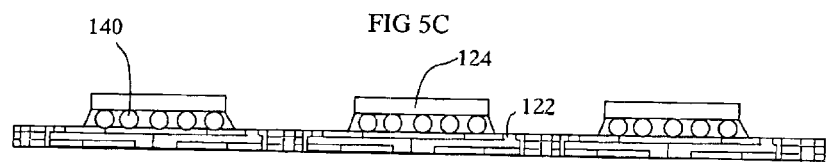
Figure 5D:
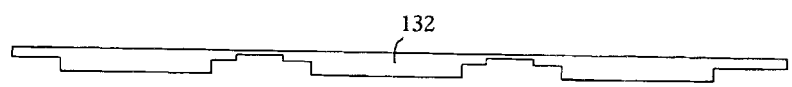
Figure 5E:
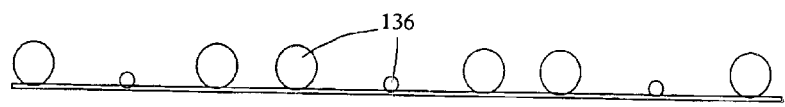
Figure 5F:
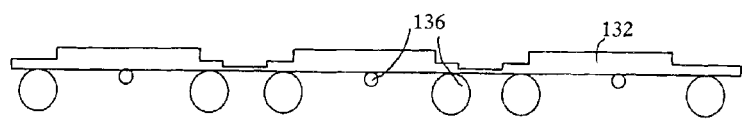
Figure 5G:
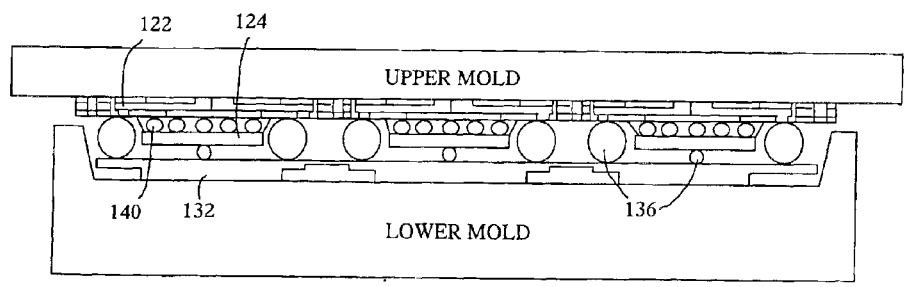
Figure 5H:
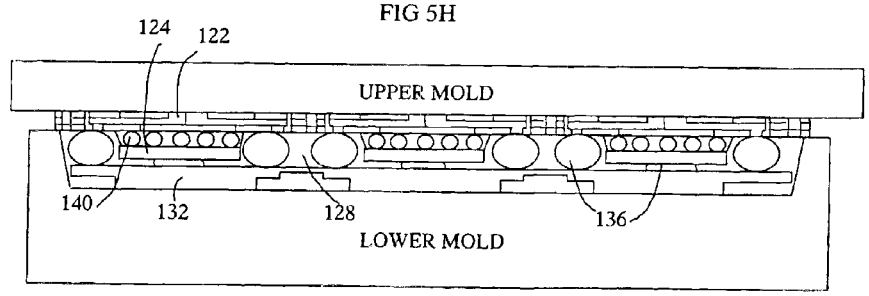
Figure 5I:
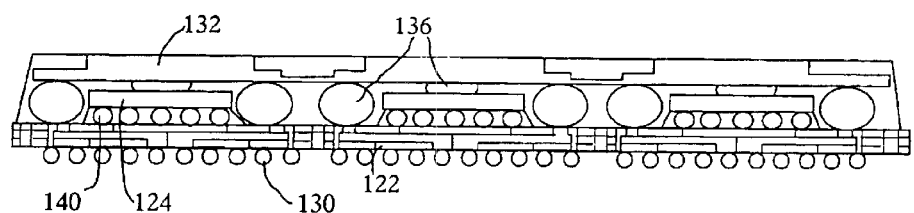
Figure 5J:
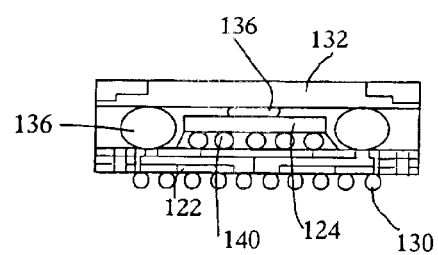

Reference is now made to FIGS. 5A to 5J to describe a process for manufacturing the ball grid array package 120, in accordance with another embodiment of the present invention. FIGS. 5A to 5E are similar to FIGS. 3A to 3E and therefore need not be further described herein. In FIG. 5F, however, the collapsible spacers 136 are mounted to the heat spreader 132, rather than the substrate 122. The heat spreader 132, in the array format, is then placed in the bottom of the die cavity, on the lower surface of the mold such that the collapsible spacers 136 protrude into the mold cavity. Features of the mold cavity and the frame are designed such that the heat spreader 132 aligns with the substrate 122 in the die cavity. The substrate array strip 122 is clamped to a surface of an upper mold die, in the mold cavity such that the semiconductor die 124 protrudes from the substrate 22 into the mold cavity. The collapsible spacers 136, in the array format, are thus disposed between the heat spreader 132 and the substrate 122 and between the heat spreader 132 and the semiconductor die 124 (FIG. 5G). FIGS. 5H to 5J are similar to FIGS. 3I to 3J and therefore need not be further described herein.

Figure 6A:
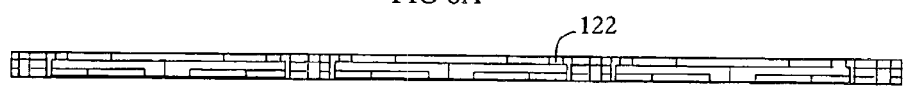
FIGS. 6A to 6J show processing steps for manufacturing a ball grid array package, in accordance with yet another embodiment of the present invention.
Figure 6B:
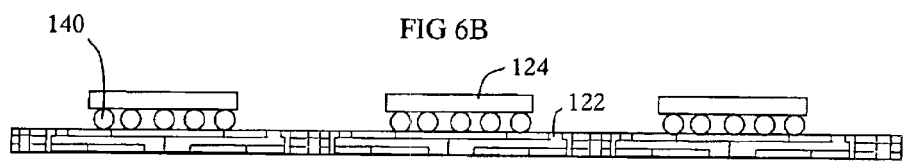
Figure 6C:
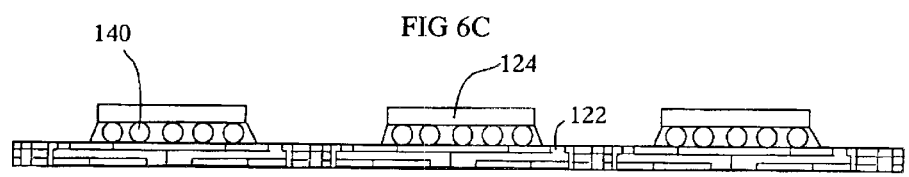
Figure 6D:
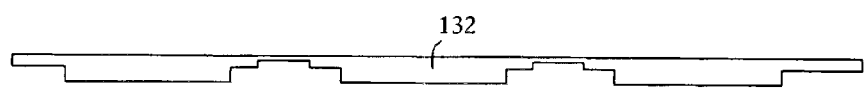
Figure 6E:
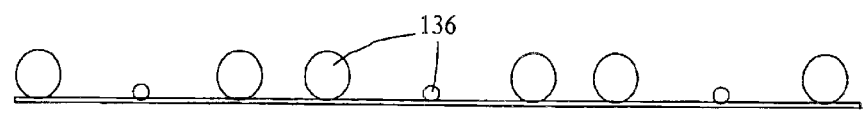
Figure 6F:
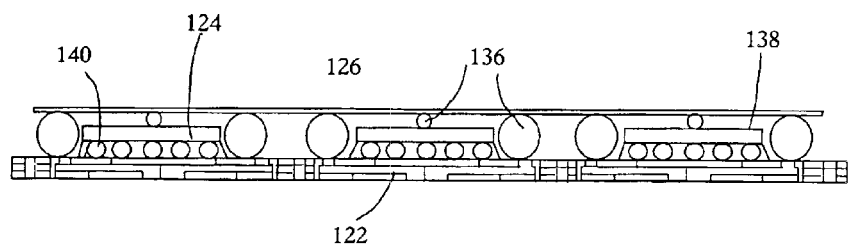
Figure 6G:
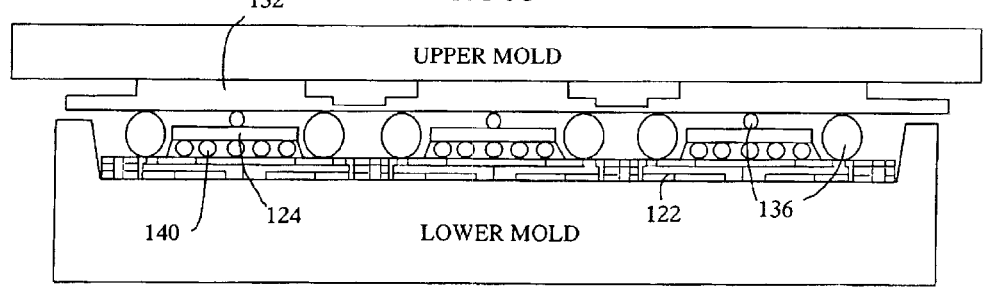

Referring now to FIGS. 6A to 6J to describe a process for manufacturing the ball grid array package 120, in accordance with yet another embodiment of the present invention, FIGS. 6A to 6F are similar to FIGS. 3A to 3F and therefore need not be further described herein. In FIG. 6G, however, the substrate 122 is placed in the bottom of the mold die cavity, on the lower surface of the mold. Features of the mold cavity and the frame are designed such that the substrate 122 aligns with the heat spreader 132. The semiconductor die 124 and the collapsible spacers 136 protrude from the substrate 122. The heat spreader 132 is clamped to the surface of the upper mold die in the mold cavity. The collapsible spacers 136, in the array format, are thus disposed between the heat spreader 132 and the substrate 122.

Figure 6H:
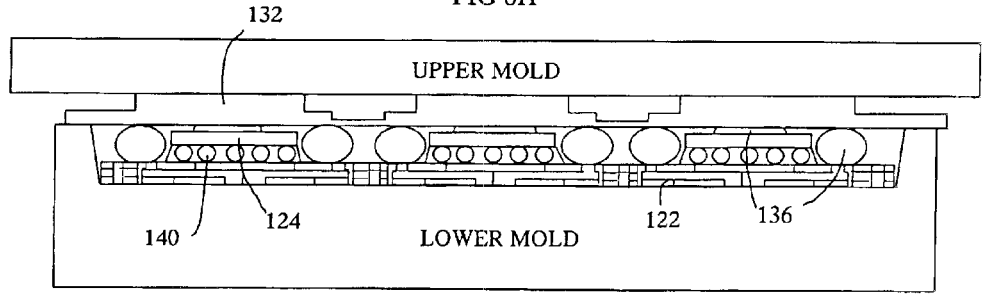

Molding using a molding compound 128 in the mold die cavity follows. During molding, the collapsible spacers 136 are compressed between the substrate 122 and the heat spreader 132 and between the semiconductor die 124 and the heat spreader 132, causing deformation of the collapsible spacers 136 (FIG. 6H). The substrate 122 is thereby pressed against the lower surface of the mold in the mold die cavity. The molding compound 128 encapsulates the semiconductor die 124, and the collapsible spacers 136 between the heat spreader 132 and the substrate 122, and joins the heat spreader 132 to the remainder of the package 120.

Figure 6I:
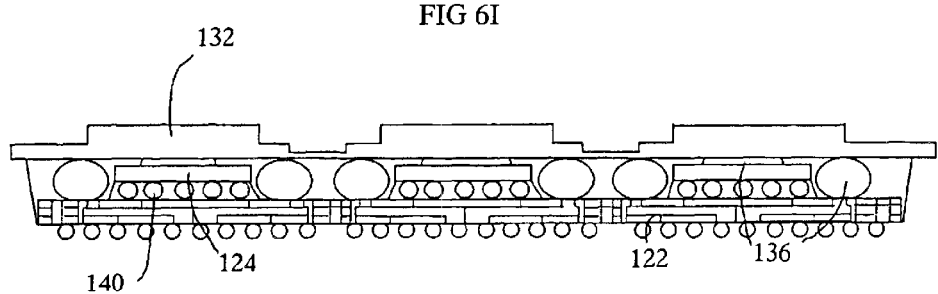
Figure 6J:
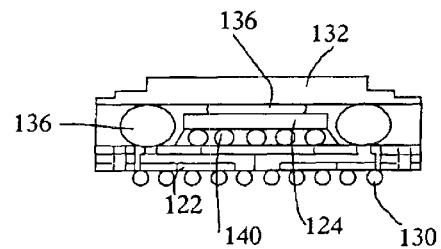

FIGS. 6I and 6J are similar to FIGS. 3I and 3J and therefore need not be further described herein.

Figure 7A:
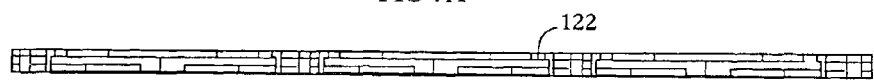
Figure 7B:
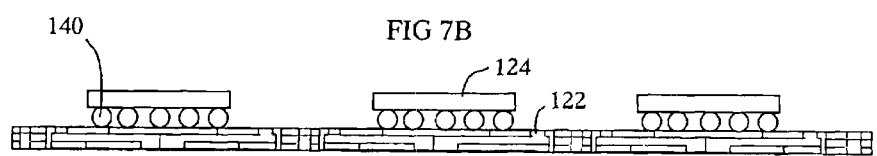
Figure 7C:
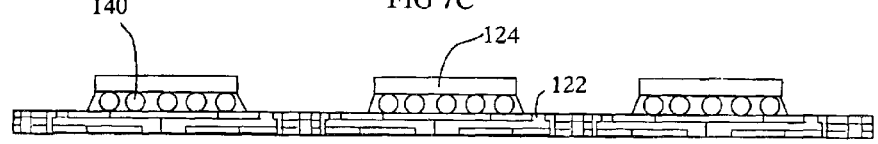
Figure 7D:
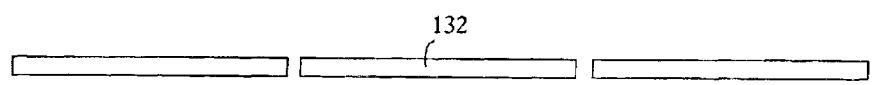

Reference is now made to FIGS. 7A to 7H to describe a process for manufacturing a ball grid array package 120 in accordance with still another embodiment. FIGS. 7A to 7C are similar to FIGS. 3A to 3C and therefore need not be further described herein. In FIG. 7D, however, individual heat spreaders 132 are manufactured. In the present embodiment, each heat spreader 132 is copper.

Figure 7E:
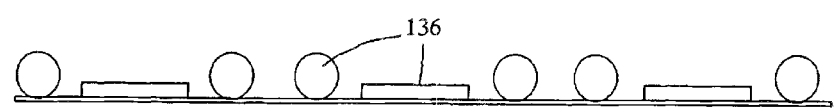
Figure 7F:
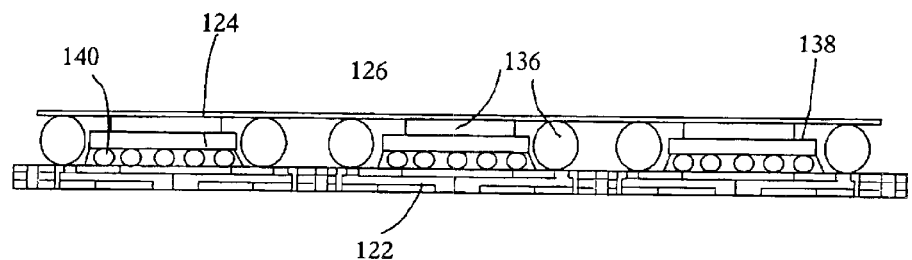

FIGS. 7E and 7F are similar to FIGS. 3E and 3F and therefore need not be further described herein.

Figure 7G:
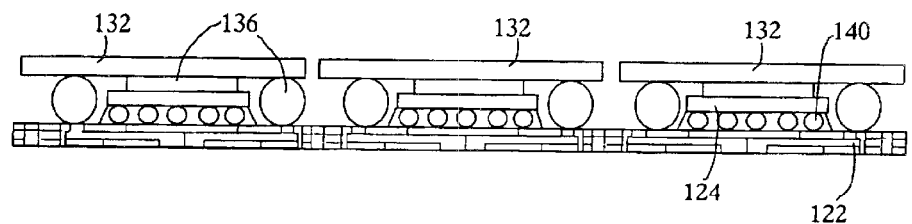

In FIG. 7G, each heat spreader 132 is individually placed on collapsible spacers 136 on a respective substrate 122 and semiconductor die 124, followed by reflow of the solder preform collapsible spacers 136. Thus, each heat spreader 136 is fixed to both the substrate 122 and the respective semiconductor die 124. In an alternative embodiment, the collapsible spacers 136 are made of a thermoplastic material with low modulus, such as polycarbonate. In this embodiment, each heat spreader 132 is individually placed on a collapsible spacer 136 on a respective substrate 122 and a semiconductor die 124, followed by thermally setting the collapsible spacers 136. In each case, each heat spreader 136 is fixed to both the substrate 122 and the semiconductor die 124 by the collapsible spacers 136.

After fixing the heat spreader 136 to the substrate 122 and the semiconductor die 124, the solder balls 130, in the form of a ball grid array, are formed on the lower surface of the substrate 122 by conventional positioning (FIG. 7G). To attach the solder balls 130, a flux is added to the balls prior to placement and, after placement the solder balls 130 are reflowed using known reflow techniques. The solder balls 130 are thereby connected to the conductive traces of the substrate 122 and through the solder bumps 140 of the semiconductor die 124 to the semiconductor die 124. The solder balls 130 provide signal and power connections as well as ground connections for the semiconductor die 124.

Figure 7H:
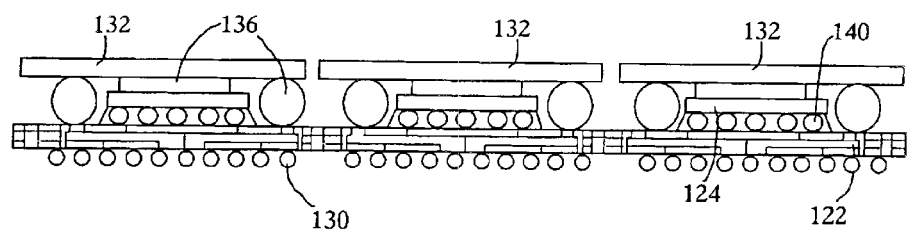
Figure 7I:
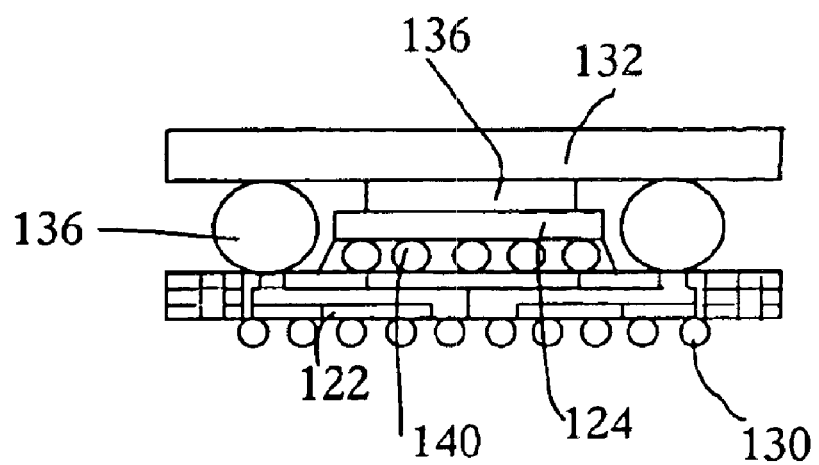

Singulation of the individual BGA unit from the array strip is then performed either by saw singulation or die punching, resulting in the configuration shown in FIG. 7H. Thus, the individual BGA package is isolated from the strip.

Figure 8A:
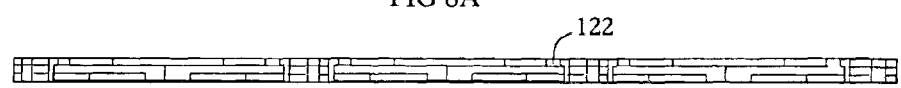
FIGS. 8A to 8H show processing steps for manufacturing a ball grid array package, in accordance with still another embodiment of the present invention.
Figure 8B:
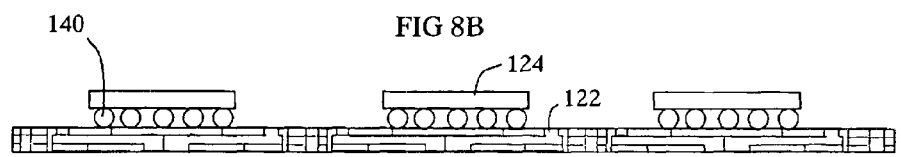
Figure 8C:
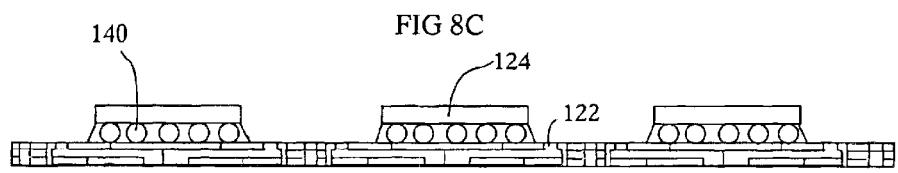
Figure 8D:
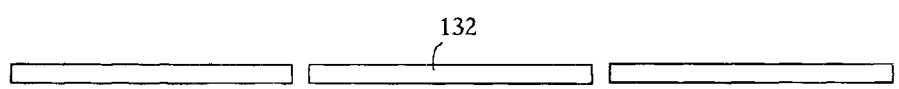

Reference is now made to FIGS. 8A to 8H to describe a process for manufacturing a ball grid array package 120 in accordance with still another embodiment. FIGS. 8A to 8C are similar to FIGS. 5A to 5F and therefore need not be further described herein. In FIG. 8D, however, individual heat spreaders 132 are manufactured.

Figure 8E:
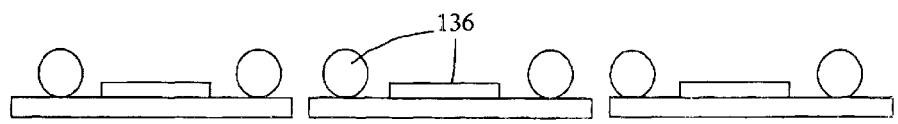
Figure 8F:
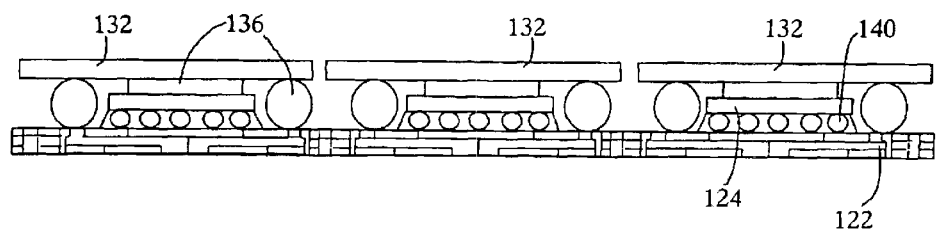

Next, collapsible spacers 136 are mounted to the individual heat spreaders 136 as shown in FIG. 8E, using, for example, epoxy. Each heat spreader 136, including the collapsible spacers 136, is placed on and mounted to the substrate 122 and a respective semiconductor die 124, as shown in FIG. 8F. Reflow of the solder preform collapsible spacers 136 follows. Thus, each heat spreader 136 is fixed to both the substrate 122 and the respective semiconductor die 124. In an alternative embodiment, the collapsible spacers are made of a thermoplastic material with low modulus, such as polycarbonate. In this embodiment, the heat spreader 132 is placed on the substrate 122, followed by thermally setting the collapsible spacer 136. In each case, the heat spreader 136 is fixed to both the substrate 122 and the semiconductor die 124 by the collapsible spacers.

Figure 8G:
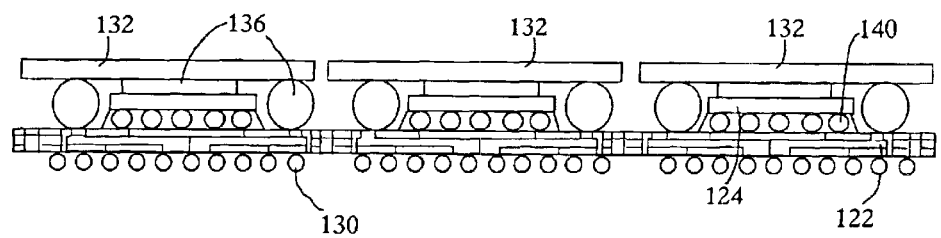

After fixing the heat spreaders 136 to the substrate 122 and the semiconductor dice 124, the solder balls 130, in the form of a ball grid array, are formed on the lower surface of the substrate 122 by conventional positioning (FIG. 8G). To attach the solder balls 130, a flux is added to the balls prior to placement and, after placement the solder balls 130 are reflowed using known reflow techniques. The solder balls 130 are thereby connected to the conductive traces of the substrate 122 and through the solder bumps 140 of the semiconductor die 124 to the semiconductor die 124. The solder balls 130 provide signal and power connections as well as ground connections for the semiconductor die 124.

Figure 8H:
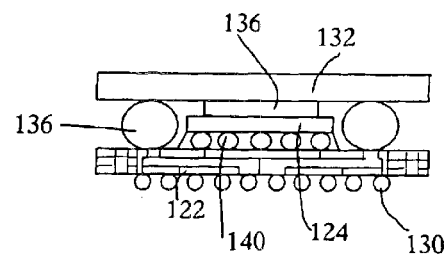

Singulation of the individual BGA unit from the array strip is then performed either by saw singulation or die punching, resulting in the configuration shown in FIG. 8H. Thus, the individual BGA package is isolated from the strip.

Alternative embodiments and variations are possible. In one alternative embodiment, the collapsible spacers 136 are individually placed on the substrate 122 and die adapter 134 or on the heat spreader 132, rather than being manufactured in the form of an array. The collapsible spacers 136 are placed in the appropriate position with predispensed flux using pick and place technology, followed by solder reflow. In still another alternative embodiment, epoxy is pre-applied to the substrate 122 and the die adapter 134 or on the heat spreader 132, the collapsible spacers 136 are placed using pick and place technology and the epoxy is cured.

For example, rather than placing the heat spreader in the bottom of the mold cavity and clamping the substrate to the top mold die, the substrate can be placed in the bottom of the mold cavity and the heat spreader clamped to the top of the mold die. Rather than etching a copper strip to prepare the array frame of heat spreaders 132, the frame can be manufactured by metal stamping. Also, the heat spreader is not limited to copper as other suitable heat spreader materials are possible and will occur to those skilled in the art. In the above-described embodiments, the collapsible spacers are mounted to the substrate or the heat spreader using epoxy, however other means for mounting the collapsible spacers are possible. For example, the collapsible spacers can be mounted using solder reflow technique. Also, the collapsible spacers are not limited to solder preform as other suitable materials can be employed, including for example, low modulus conductive polymer such as silicone or a thermoplastic material with low modulus such as polycarbonate. Still other embodiments and variations may occur to those of skill in the art. All such embodiments and variations are believed to be within the scope and sphere of the present invention.

What is claimed is:

1. A process for manufacturing an integrated circuit package comprising:
   mounting a semiconductor die, to a first surface of a substrate such that bumps on said semiconductor die are electrically connected to conductive traces of said substrate;
   mounting at least one collapsible spacer to at least one of a heat spreader, said semiconductor die and said substrate;
   fixing said heat spreader to at least one of said first surface of said substrate and said semiconductor die such that said at least one collapsible spacer is disposed therebetween;
   forming a ball grid array on a second surface of said substrate, bumps of said ball grid array being electrically connected to said conductive traces; and
   singulating said Integrated circuit package,
   wherein fixing said heat spreader comprises:
   placing one of said heat spreader and said substrate in a mold cavity of a mold;
   releasably clamping the other of said heat spreader and said substrate to a die of said mold cavity, such that said at least one collapsible spacer is disposed between said heat spreader and said substrate; and
   molding a molding compound in the mold cavity, thereby molding the semiconductor die, the substrate, said at least one collapsible spacer and said heat spreader into the molding compound to provide a molded package.

2. The process for manufacturing an integrated circuit package according to claim 1, wherein fixing said heat spreader comprises thermal curing of the at least one collapsible spacer.

3. The process for manufacturing an integrated circuit package according to claim 1, wherein fixing said heat spreader comprises reflowing of the at least one collapsible spacer.

4. The process according to claim 1, wherein said mounting a semiconductor die comprises mounting said semiconductor die in a flip-chip orientation, to said substrate.

5. The process according to claim 4, wherein said mounting said semiconductor die comprises solder reflowing thereby connecting said bumps of said semiconductor die in said flip-chip orientation to said conductive traces of said substrate.

6. The process according to claim 4, wherein said mounting further comprises underfilling said semiconductor die.

7. The process according to claim 1, wherein said placing one of said heat spreader and said substrate in a mold cavity comprises placing said heat spreader in said mold cavity such that said heat spreader rests on a lower die of said mold and said releasably clamping comprises releasably clamping said substrate to an upper die of said mold.

8. The process according to claim 1, wherein said placing one of said heat spreader and said substrate in a mold cavity comprises placing said substrate in said mold cavity such that said substrate rests on a lower die of said mold and said releasably clamping comprises releasably clamping said heat spreader to an upper die of said mold.

9. The process according to claim 1, wherein said mounting at least one collapsible spacer comprises mounting said at least one collapsible spacer to said substrate.

10. The process according to claim 1, wherein said mounting at least one collapsible spacer comprises mounting said at least one collapsible spacer to said heat spreader.

11. The process according to claim 1, wherein said at least one collapsible spacer comprises a plurality of collapsible spacers, and mounting said at least one collapsible spacer comprises mounting one of said plurality of collapsible spacers to said semiconductor die and mounting at least another of said collapsible spacers to said substrate.

12. The process according to claim 11, wherein said one of said plurality of collapsible spacers is disposed between and in contact with said heat spreader and said semiconductor die during molding.

13. The process according to claim 12, wherein said at least another of said collapsible spacers is disposed in contact with said heat spreader during molding.

14. A process for manufacturing a plurality of integrated circuit packages comprising: mounting a plurality of semiconductor dice to a first surface of a substrate array such that bumps on said semiconductor dice are electrically connected to conductive traces of said substrate;
   mounting a collapsible spacer array to one of a heat spreader array and said substrate array;
   placing one of said heat spreader array and said substrate array in a mold cavity of a mold;
   releasably clamping the other of said heat spreader array and said substrate array to a first die of said mold such that said collapsible spacer array is disposed between said heat spreader array and said substrate array;

molding a molding compound in the mold cavity, thereby molding the semiconductor dice, said substrate array, said collapsible spacer array and said heat spreader array into the molding compound to provide an array of molded packages;

forming a plurality of ball grid arrays on a second surface of said substrate array, bumps of said ball grid arrays being electrically connected to said conductive traces; and singulating each integrated circuit package from said array of molded packages.

15. The process according to claim 14, wherein said mounting said plurality of semiconductor dice comprises mounting said semiconductor dice in a flip-chip orientation, to said substrate array.

16. The process according to claim 15, wherein said mounting said plurality of semiconductor dice comprises solder reflowing thereby connecting said bumps of said semiconductor dice in said flip-chip orientation to said conductive traces of said substrate array.

17. The process according to claim 15, wherein said mounting said plurality of semiconductor dice further comprises underfilling said semiconductor dice.

18. The process according to claim 14, wherein said placing one of said heat spreader array and said substrate array in a mold cavity comprises placing said heat spreader array in said mold cavity such that said heat spreader array rests on a lower die of said mold and said releasably clamping comprises releasably clamping said substrate array to an upper die of said mold.

19. The process according to claim 14, wherein said placing one of said heat spreader array and said substrate array in a mold cavity comprises placing said substrate array in said mold cavity such that said substrate array rests on a lower die of said mold and said releasably damping, comprises releasably clamping said heat spreader array to an upper die of said mold.

20. The process according to claim 14, wherein said mounting said collapsible spacer array comprises mounting said collapsible spacer array to said substrate array.

21. The process according to claim 20, wherein mounting said collapsible spacer array further comprises mounting a corresponding collapsible spacer of said collapsible spacer array to each of said plurality of semiconductor dice.

22. The process according to claim 21, wherein said collapsible spacer array is disposed between and in contact with said plurality of semiconductor dice and said heat spreader array during molding.

23. The process according to claim 14, wherein said mounting said collapsible spacer array comprises mounting said collapsible spacer array to said heat spreader array.

* * * * *